(12) United States Patent
Kanakasabapathy et al.

(10) Patent No.: US 8,901,670 B2
(45) Date of Patent: Dec. 2, 2014

(54) SEMICONDUCTOR DEVICE INCLUDING MULTIPLE METAL SEMICONDUCTOR ALLOY REGION AND A GATE STRUCTURE COVERED BY A CONTINUOUS ENCAPSULATING LAYER

(75) Inventors: Sivananda K. Kanakasabapathy, Niskayuna, NY (US); Hemanth Jagannathan, Guilderland, NY (US); Soon-Cheon Seo, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/604,143

(22) Filed: Sep. 5, 2012

(65) Prior Publication Data

US 2012/0326217 A1   Dec. 27, 2012

Related U.S. Application Data

(63) Continuation of application No. 13/025,470, filed on Feb. 11, 2011.

(51) Int. Cl.
*H01L 21/02* (2006.01)
*H01L 29/786* (2006.01)
*H01L 29/49* (2006.01)
*H01L 21/8238* (2006.01)
*H01L 29/66* (2006.01)

(52) U.S. Cl.
CPC ..... *H01L 29/78606* (2013.01); *H01L 29/66545* (2013.01); *H01L 29/4966* (2013.01); *H01L 29/4908* (2013.01); *H01L 21/823835* (2013.01); *H01L 29/66772* (2013.01)
USPC ..................................... 257/388; 257/E29.16

(58) Field of Classification Search
CPC ................. H01L 21/82345; H01L 21/823468; H01L 21/823465; H01L 21/823835; H01L 21/823443
USPC ............. 257/288, E29.255, E29.16, E29.159, 257/E29.161, E21.639, 29.158, E21.64, 257/E21.623, E21.625, E21.626, 388, 389
See application file for complete search history.

(56) References Cited

U.S. PATENT DOCUMENTS

| | | | |
|---|---|---|---|
| 5,840,624 | A | 11/1998 | Jang et al. |
| 6,046,103 | A | 4/2000 | Thei et al. |
| 6,080,648 | A | 6/2000 | Nagashima |
| 6,096,642 | A | 8/2000 | Wu |
| 6,117,723 | A | 9/2000 | Huang |

(Continued)

FOREIGN PATENT DOCUMENTS

EP          0295367 A1     12/1988

OTHER PUBLICATIONS

Office Action dated Dec. 12, 2012 received in a related U.S. Appl. No. 13/025,470.

(Continued)

*Primary Examiner* — Daniel Luke
*Assistant Examiner* — Latanya N Crawford
(74) *Attorney, Agent, or Firm* — Scully, Scott, Murphy & Presser, P.C.

(57) ABSTRACT

A method of forming a semiconductor device is provided that in some embodiments encapsulates a gate silicide in a continuous encapsulating material. By encapsulating the gate silicide in the encapsulating material, the present disclosure substantially eliminates shorting between the gate structure and the interconnects to the source and drain regions of the semiconductor device.

12 Claims, 4 Drawing Sheets

(56) References Cited

U.S. PATENT DOCUMENTS

| | | | |
|---|---|---|---|
| 6,130,145 A | 10/2000 | Ilg et al. | |
| 6,235,627 B1 | 5/2001 | Nakajima | |
| 6,448,140 B1 | 9/2002 | Liaw | |
| 7,615,831 B2 | 11/2009 | Zhu et al. | |
| 7,659,171 B2 | 2/2010 | Furukawa et al. | |
| 2005/0191833 A1 | 9/2005 | Chang et al. | |
| 2007/0278587 A1* | 12/2007 | Aoyama et al. | 257/369 |
| 2007/0278593 A1 | 12/2007 | Watanabe | |
| 2007/0296052 A1* | 12/2007 | Lee et al. | 257/478 |
| 2008/0079087 A1 | 4/2008 | Nam et al. | |
| 2008/0079097 A1* | 4/2008 | Inokuma | 257/411 |
| 2008/0085590 A1 | 4/2008 | Yao et al. | |
| 2008/0093675 A1 | 4/2008 | Yao et al. | |
| 2008/0277726 A1* | 11/2008 | Doris et al. | 257/351 |
| 2008/0290421 A1* | 11/2008 | Wang et al. | 257/384 |
| 2009/0283852 A1* | 11/2009 | Gutmann et al. | 257/510 |
| 2010/0090321 A1* | 4/2010 | Mulfinger et al. | 257/632 |
| 2010/0258880 A1* | 10/2010 | Tsuchiya et al. | 257/369 |
| 2010/0327365 A1* | 12/2010 | Iwamoto | 257/369 |
| 2011/0049639 A1* | 3/2011 | Doornbos et al. | 257/368 |
| 2011/0248343 A1* | 10/2011 | Guo et al. | 257/347 |
| 2012/0322251 A1* | 12/2012 | Cheng et al. | 438/586 |
| 2013/0020616 A1* | 1/2013 | Ayala et al. | 257/288 |

OTHER PUBLICATIONS

U.S. Notice of Allowance dated Jul. 9, 2013 issued in parent U.S. Appl. No. 13/025,470.

* cited by examiner

SEMICONDUCTOR DEVICE INCLUDING MULTIPLE METAL SEMICONDUCTOR ALLOY REGION AND A GATE STRUCTURE COVERED BY A CONTINUOUS ENCAPSULATING LAYER

CROSS REFERENCE TO RELATED APPLICATION

This application is a continuation of U.S. patent application Ser. No. 13/025,470, filed Feb. 11, 2011 the entire content and disclosure of which is incorporated herein by reference.

BACKGROUND

The present disclosure relates generally to semiconductor integrated circuits. More particularly, the present disclosure relates to scaling of semiconductor devices, such as metal oxide semiconductor field effect transistors (MOSFETs). In order to be able to make integrated circuits, such as memory, logic, and other devices, of higher integration density than currently feasible, one has to find ways to further downscale the dimensions of field effect transistors (FETs), such as MOSFETs and complementary metal oxide semiconductors (CMOS). Scaling achieves compactness and improves operating performance in devices by shrinking the overall dimensions of the device.

SUMMARY

A method of forming a semiconductor device is provided that in some embodiments encapsulates a gate silicide in a continuous encapsulating material. By encapsulating the gate silicide in a continuous encapsulating material, the present disclosure substantially eliminates shorting of the gate structure to the source and drain regions of the semiconductor device. In one embodiment, the method for forming the semiconductor device includes forming a gate structure on a semiconductor substrate. The gate structure includes a semiconductor containing gate conductor. A spacer is adjacent to sidewalls of the gate structure. A source region and a drain region, each having a surface of a first metal semiconductor alloy, are present in the semiconductor substrate on opposing sides of the gate structure. A first interlevel dielectric layer is formed over the surface of the first metal semiconductor alloy. The first interlevel dielectric layer has an upper surface that is coplanar with the upper surface of the gate structure. The semiconductor containing gate conductor is converted to a second metal semiconductor alloy, and the first interlevel dielectric layer is removed. A continuous encapsulating layer is formed over the surface of the first metal semiconductor alloy, the spacer and the gate structure. A second interlevel dielectric layer is formed on the continuous encapsulating layer. Interconnects are formed to the surface of the first metal semiconductor alloy on the source region and the drain region.

In another embodiment, a method of forming a semiconductor device is provided that includes forming a gate structure on a semiconductor substrate, in which a portion of the gate structure is composed of a semiconductor containing gate conductor. A source region and a drain region are present in the semiconductor substrate on opposing sides of the gate structure. A first metal semiconductor alloy is present on the surface of each of the source region and the drain region. A conformal dielectric layer is formed over the gate structure and on a surface of the first metal semiconductor alloy. A first interlevel dielectric layer is formed over the conformal dielectric layer, and is planarized to expose an upper surface of the gate structure. The remaining portions of the conformal dielectric layer and the first interlevel dielectric layer have an upper surface that is substantially coplanar with the upper surface of the gate structure. The semiconductor containing gate conductor of the gate structure is converted to a second metal semiconductor alloy, and the first interlevel dielectric layer is removed. A continuous encapsulating layer is formed in direct contact with the remaining portion of the conformal dielectric layer and over the second metal semiconductor alloy of the gate structure. A second interlevel dielectric layer is formed on the continuous encapsulating layer, and interconnects are formed through the second interlevel dielectric layer to the surface of the first metal semiconductor alloy on the source region and the drain region.

In another aspect, a semiconductor device is provided that includes a gate structure on a channel region of a semiconductor substrate. The gate structure includes a gate dielectric on the semiconductor substrate, a metal gate conductor on the gate dielectric and a metal semiconductor alloy gate conductor on the metal gate conductor. At least one spacer is present on the sidewalls of the gate structure, and a source region and a drain region are present in contact with the semiconductor substrate on opposing sides of the channel region. Each of the source region and the drain region includes a metal semiconductor contact having a different composition than the metal semiconductor alloy gate conductor. A continuous encapsulating layer is present extending over the gate structure, the at least one spacer and the source and drain region.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Figure 1:
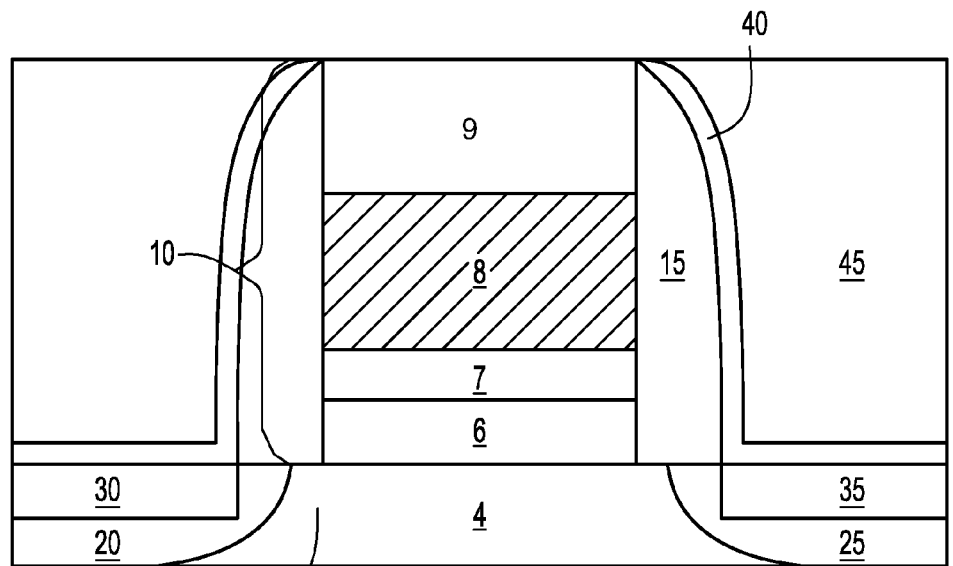
FIG. 1 is a side cross-sectional view depicting one embodiment of an initial structure of the disclosed method including a gate structure on a semiconductor substrate including a semiconductor containing gate conductor, a source region and a drain region present in the semiconductor substrate on opposing sides of the gate structure, a spacer adjacent to the gate structure, a first metal semiconductor alloy atop the source region and the drain region, and a conformal dielectric layer over the gate structure and the surface of the first metal semiconductor alloy, in accordance with the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It has been determined that one consequence of scaling semiconductor devices, such as field effect transistors (FETs), is that as the distance between adjacent semiconductor devices is decreased it is becomes increasingly difficult to form interconnects to source and drain region of the semiconductor devices without shorting the gate structures. In one aspect, the present disclosure provides a process sequence for manufacturing a semiconductor device that forms a first metal semiconductor alloy on the source and drain regions of the semiconductor device, and forms a second metal semiconductor alloy in the gate structure of the semiconductor device, before the gate structure is encapsulated in an encapsulating dielectric layer. The encapsulating dielectric layer is a single material layer that can function as an etch stop during the forming of via openings to the source and drain regions. Therefore, because the encapsulating dielectric layer is present over the gate structure of the semiconductor device, and the via openings for the interconnects are formed using an etch that is selective to the encapsulating dielectric layer, the encapsulating dielectric layer allows for a self aligned contact forming process that substantially eliminates shorting to the gate structure.

FIGS. 1-7 depict a method of forming a semiconductor device 100 that utilizes a continuous encapsulating layer 50 to electrically isolate a gate structure 10 including a metal semiconductor gate conductor from being shorted to the interconnects 60 to the source and drain regions 20, 25 of the semiconductor device 100. The method depicted in FIGS. 1-7 is suitable for forming any semiconductor device that contains a gate structure. As used herein, "semiconductor device" refers to an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentrations in an extrinsic semiconductor determine the conductivity type of the semiconductor, e.g., n-type or p-type conductivity.

In one embodiment, the semiconductor device 100 is a field effect transistor (FET). A field effect transistor (FET) is a semiconductor device 100 in which output current, i.e., source-drain current, is controlled by the voltage applied to a gate structure 10. A field effect transistor has three terminals, i.e., a gate structure 10, a source region 20, and a drain region 25. The gate structure 10 is a structure used to control output current, i.e., flow of carriers in the channel, i.e., channel region, of a semiconducting device, such as a field effect transistor, through electrical or magnetic fields. The channel region 4 which is located between the source region 20 and the drain region 25 of a field effect transistor (FET), becomes conductive when the semiconductor device 100 is turned on. The source region 20, is a doped region in the semiconductor device 100, in which majority carriers are flowing into the channel region 4. The drain region 25 is the doped region in the semiconductor device 100 that is located at the end of the channel region 4, in which carriers are flowing out of the semiconductor device 100 through the drain region 25. Although, FIGS. 1-7 of the present disclosure depict a field effect transistor (FET), any semiconductor device having a gate structure is applicable to the present disclosure.

By "continuous encapsulating layer" it is meant that a single material layer of a single material composition is formed over the entirety of the gate structure, in which the single material layer is entirely devoid of break or void through the thickness of the single material layer. In some embodiments, the continuous encapsulating layer 50 is composed of a dielectric material that electrically isolates the gate structure 10 from the interconnects 60. A dielectric material is a material having a room temperature conductivity of less than $10^{-10}$ $(\Omega\text{-m})^{-1}$.

FIG. 1 illustrates the results of the initial processing steps that produce a gate structure 10 on a semiconductor substrate 5 including a semiconductor containing gate conductor 8, a source region 20 and a drain region 25 present in the semiconductor substrate 5 on opposing sides of the gate structure 10, at least one spacer 15 adjacent to the gate structure 10, a first metal semiconductor alloy 30, 35 atop the source region 20 and the drain region 25, and a conformal dielectric layer 40 over the gate structure 10 and the surface of the first metal semiconductor alloy 30, 35.

The semiconductor substrate 5 may be composed of a silicon containing material. Silicon containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. The semiconductor substrate 5 may also be composed of other semiconductor materials, such as germanium, and compound semiconductor substrates, such as type III/V semiconductor substrates, e.g., GaAs. Although the semiconductor substrate 5 is depicted as a bulk semiconductor substrate, semiconductor on insulator (SOI) substrate arrangements, such as silicon on insulator substrates, are also suitable for the semiconductor substrate 5.

Still referring to FIG. 1, a gate structure 10 is formed atop the semiconductor substrate 5. In one embodiment, the gate structure 10 includes a gate dielectric 6 present on the semiconductor substrate 5, a metal gate conductor 7 on the gate dielectric 6, a semiconductor containing gate conductor 8 present on the metal gate conductor 7, and a first dielectric cap 9 present on the semiconductor containing gate conductor 8.

In one embodiment, the gate structure 10 is formed on the channel region 4 of the semiconductor substrate 5. In one embodiment, a gate dielectric 6 is formed in direct contact with the channel region 4 of the semiconductor substrate 5. The gate dielectric 6 may be composed of any dielectric material. For example, the gate dielectric 6 may be composed of an oxide, nitride or oxynitride material. The gate dielectric 6 may be composed of a high-k dielectric material. The term "high-k" denotes a material having a dielectric constant that is greater than the dielectric constant of silicon oxide ($SiO_2$) at room temperature, i.e., 20° C. to 25° C. In one embodiment, the high-k dielectric that provides the gate dielectric 6 is comprised of a material having a dielectric constant that is greater than 4.0, e.g., 4.1. In another embodiment, the high-k gate dielectric that provides the gate dielectric 6 is comprised of a material having a dielectric constant greater than 7.0. In yet another embodiment, the high-k gate dielectric that provides the gate dielectric 6 is comprised of a material having a dielectric constant ranging from greater than 4.0 to 30. The dielectric constants mentioned herein are relative to a vacuum at room temperature, i.e., 20° C. to 25° C.

In one example, a high-k gate dielectric 6 is provided by hafnium oxide ($HfO_2$). Other examples of suitable high-k dielectric materials for the gate dielectric 6 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

In one embodiment, the gate dielectric 6 is formed using a deposition process, such as chemical vapor deposition (CVD). In another embodiment, the gate dielectric 6 may be formed by a thermal growth process such as, for example, oxidation, nitridation or oxynitridation. The gate dielectric 6 may have a thickness ranging from 1 nm to 5 nm. In another embodiment, the gate dielectric 6 has a thickness ranging from 1 nm to 2.5 nm. In yet another example, the gate dielectric 6 has a thickness that ranges from 15 Å to 20 Å.

In one embodiment, the metal gate conductor 7 is formed in direct contact with the gate dielectric 6. By "metal gate conductor" it is meant that the conductive structure is composed of metal elements, and that the metal gate conductor is not composed of a semiconductor element.

The metal gate conductor 7 may be composed of a work function metal layer. In one embodiment, in which the semiconductor device is an n-type semiconductor device, such as an nFET, the work function metal layer that provides the metal gate conductor 7 is an n-type work function metal layer. As used herein, an "n-type work function metal layer" is a metal layer that effectuates an n-type threshold voltage shift. As used herein, "threshold voltage" is the lowest attainable gate voltage that will turn on a semiconductor device, e.g., transistor, by making the channel of the device conductive. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV. In one embodiment, the n-type work function metal layer is composed of at least one of TiAl, TaN, TiN, HfN, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. Examples of sputtering apparatus that may be suitable for depositing the n-type work function metal layer include DC diode type systems, radio frequency (RF) sputtering, magnetron sputtering, and ionized metal plasma (IMP) sputtering.

In another embodiment, in which the semiconductor device is a pFET, the metal gate conductor 7 may be a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In one embodiment, a semiconductor containing gate conductor 8 is formed in direct contact with the metal gate conductor 7. By "semiconductor containing gate conductor" it is meant that the gate conductor is composed of semiconductor element that is free of metal elements. The semiconductor containing gate conductor 8 may be composed of a silicon containing material. Examples of silicon containing materials include, but are not limited to, silicon, single crystal silicon, polycrystalline silicon, silicon germanium, and amorphous silicon. In one embodiment, the semiconductor containing gate conductor 8 is provided by a doped semiconductor, such as n-type doped polysilicon.

In one embodiment, the semiconductor containing gate conductor 8 is deposited and then doped by ion implantation. The material for the semiconductor containing gate conductor 8 may be deposited using chemical vapor deposition (CVD). Chemical vapor deposition (CVD) is a deposition process in which a deposited species is formed as a result of chemical reaction between gaseous reactants at room temperature or greater, wherein the solid product of the reaction is deposited on the surface on which a film, coating, or layer of the solid product is to be formed. Variations of CVD processes suitable for depositing the material that provides the semiconductor containing gate conductor 8 include, but are not limited to, Atmospheric Pressure CVD (APCVD), Low Pressure CVD (LPCVD) and Plasma Enhanced CVD (EPCVD), Metal-Organic CVD (MOCVD) and others. The semiconductor containing gate conductor 8 may be doped using ion implantation following the deposition of the material for the semiconductor containing gate conductor 8. In another embodiment, the semiconductor containing gate conductor 8 may be in-situ doped as the material layer for the semiconductor containing gate conductor 8 is formed.

The first dielectric cap 9 may present in direct contact with the semiconductor containing gate conductor 8. The first dielectric cap 9 may be composed of a dielectric material that can be etched selectively to the semiconductor containing gate conductor 8, and etched selectively to a subsequently formed first interlevel dielectric layer. In one embodiment, the first dielectric cap 9 may be composed of amorphous carbon ($\alpha$:C). Amorphous carbon is an allotrope of carbon with substantially no crystalline structure. Hydrogenated amorphous carbon ($\alpha$:C:H) and/or tetrahedral amorphous carbon (ta-C) (also called diamond-like carbon) may also be employed for the first dielectric cap 9. It is noted that the above materials for the first dielectric cap 9 are provided for illustrative purposes only, and are not intended to limit the present disclosure, as any dielectric material may be utilized for the first dielectric cap 9. For example, the first dielectric cap 9 may be composed of an oxide, nitride or oxynitride material.

In one embodiment, the gate structure 10 is formed by depositing blanket layers for each of the gate dielectric 6, the metal gate conductor 7, the semiconductor containing gate conductor 8 and the first dielectric cap 9 to form a gate stack, and then patterning and etching the gate stack to form the gate structure 10. More specifically, a pattern is produced on the gate stack by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied. For example, a first material may be removed with a selectivity of greater than 100:1 to a second material. The remaining portion of the gate stack is positioned on at least a channel region 4 of the semiconductor substrate 5, and provides the gate structure 10.

FIG. 1 also depicts one embodiment of forming at least one spacer 15 on the sidewall of the gate structure 10, and forming source regions 20 and drain regions 25 in the semiconductor substrate 5. The material of the at least one spacer 15 is typically a dielectric material. For example, the at least one spacer 15 may be an oxide, nitride or oxynitride material. In one example, the at least one spacer 15 is composed of silicon oxide. In another example, the at least one spacer 15 is composed of silicon nitride.

The at least one spacer 15 may be formed using deposition, photolithography and etch processes. In one embodiment, the material for the at least one spacer 15 is first blanket deposited over the gate structure 10 and the exposed portions of the semiconductor substrate 5. The material for the at least one spacer 15 may be deposited as a conformal layer. As used herein, "a conformal layer", such as a conformal dielectric layer, is a deposited material having a thickness that remains substantially the same regardless of the geometry of underlying features on which the layer is deposited. In one example, the thickness of the conformal layer that is deposited for the first spacer 15 varies by no greater than 20% of the average thickness for the layer.

In one embodiment, the material layer for the at least one spacer 15 may be formed using thermal growth or deposition. In one example, the material layer for the at least one spacer 15 is deposited using thermal oxidation and is composed of silicon oxide. In another example, the material layer for the at least one spacer 15 is formed by a deposition process, such as chemical vapor deposition (CVD). Variations of CVD processes suitable for the material layer for the at least one spacer 15 include, but are not limited to, Atmospheric Pressure CVD (APCVD), Low Pressure CVD (LPCVD) and Plasma Enhanced CVD (EPCVD), Metal-Organic CVD (MOCVD) and others. Following deposition, the material layer for the at least one spacer 15 is etched to remove the portions of the material layer from the upper surfaces of the semiconductor substrate 5 that are not adjacent to the gate structure 10, and from the upper surface of the gate structure 10. The etch process for forming the at least one spacer 15 may be a spacer etch back process. In one example, the etch process for forming the at least one spacer 15 is an anisotropic etch. As used herein, an "anisotropic etch process" denotes a material removal process in which the etch rate in the direction normal to the surface to be etched is higher than in the direction parallel to the surface to be etched. Examples of anisotropic etch process suitable for forming the at least one spacer 15 include, but are not limited to, reactive-ion etching (RIE), ion beam etching, plasma etching and/or laser ablation. Reactive ion etch (RIE) is a form of plasma etching, in which the surface to be etched may be placed on an RF powered electrode and takes on a potential that accelerates an etching species, which is extracted from a plasma, towards the surface to be etched, wherein a chemical etching reaction takes place in the direction normal to the surface being etched. Following etching, the remaining portion of the material layer for the at least one spacer 15 is in direct contact with the sidewall of the gate structure 10. In one embodiment, the at least one spacer 15 was a width that ranges from 1.0 nm to 10.0 nm. In another embodiment, the at least one spacer 15 has a width that ranges from 2.0 nm to 5.0 nm.

Referring to FIG. 1, a source region 20 and a drain region 25 may be on opposing sides of the channel region 4. The conductivity-type of the source region 20 and the drain region 25 determines the conductivity of the semiconductor device. The source and drain regions 20, 25 may each include a source and drain extension region, a deep source and drain region (not shown), and optionally a raised source and drain region (not shown). Conductivity-type denotes whether the source region 20 and the drain regions 25 of the semiconductor device have been doped with a p-type or n-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to, antimony, arsenic and phosphorous.

In one embodiment, the extension portion of the source region 20 and the drain region 25 is formed using an ion implantation process. In one embodiment, the dopant species for the extension portion of the source region 20 is boron (B) or $BF_2$. Boron may be implanted utilizing implant energies ranging from 0.2 keV to 3.0 keV with an implant dose ranging from $5 \times 10^{14}$ atoms/cm$^2$ to $5 \times 10^{15}$ atoms/cm$^2$. $BF_2$ may be implanted utilizing implant energies ranging from 1.0 keV to 15.0 keV and a dose ranging from $5 \times 10^{14}$ atoms/cm$^2$ to $5 \times 10^{15}$ atoms/cm$^2$. In one embodiment, a typical implant for the extension portion of the n-type drain region 25 is arsenic. The n-type extension portion of the drain region 25 can be implanted with arsenic using implant energies ranging from 1.0 keV to 10.0 keV with a dose ranging from $5 \times 10^{14}$ atoms/cm$^2$ to $5 \times 10^{15}$ atoms/cm$^2$. Typically, the dopant concentration of the extension portion of the source region 20 and the drain region 25 having a p-type dopant ranges from $5 \times 10^{19}$ atoms/cm$^3$ to $5 \times 10^{20}$ atoms/cm$^3$. In another embodiment, the dopant concentration of the extension portion of the source region 20 and the drain region 25 having p-type dopant ranges from $7 \times 10^{19}$ atoms/cm$^3$ to $2 \times 10^{20}$ atoms/cm$^3$.

The deep dopant regions (not shown) typically have the same conductivity dopant as the extension portion of the source region 20 and the drain region 25. The dopant for the deep source region and the deep drain region is present in greater concentration and at greater depths into the semiconductor substrate 5 than the dopant for the extension portion of the source region 20 and the drain region 25. In some embodiments, a halo implant (not shown) may also be formed at the corner of the junction opposite the upper surface of the channel region 4. The halo implant region is typically of an opposite conductivity, as the extension portion of the source and drain regions 20, 25, and the deep source and drain regions.

In one embodiment, a raised source region and a raised drain region (not shown) is formed on the portion of the semiconductor substrate 5 including at least the source extension region and the drain extension region. The raised source region and the raised drain region may have the same conductivity as the source extension region and the drain extension region. The raised source region and the raised drain region may be deposited using an epitaxial growth process. "Epitaxial growth and/or deposition" means the growth of a semiconductor material on a deposition surface of a semiconductor material, in which the semiconductor material being grown has the same crystalline characteristics as the semiconductor material of the deposition surface. The raised source region and the raised drain region may be doped using ion implantation after epitaxial growth, or the raised source region and raised drain region may be doped in-situ during the epitaxial growth process.

The source and drain regions 20, 25 are activated by activation annealing using an annealing processes such as, but not limited to, rapid thermal annealing, furnace annealing, flash lamp annealing or laser annealing. In one embodiment, activation anneal is conducted at a temperature ranging from 850° C. to 1350° C.

At least a portion of the semiconductor substrate 5 that contains the source and drain regions 20, 25 is converted into a first metal semiconductor alloy 30, 35. In one embodiment, the first metal semiconductor alloy 30, 35 is present at the upper surface of the semiconductor substrate 5, and is adjacent to the at least one spacer 15. In one embodiment, the first metal semiconductor alloy 30, 35 is composed of silicon and an elemental metal, which is hereafter referred to as a silicide. Silicide formation typically includes depositing a refractory metal such as Ni, Co, Pd, Pt, Rh, Ir, Zr, Cr, Hr, Er, Mo or Ti, onto the surface of a Si-containing material. The refractory metal may be deposited on the semiconductor substrate 5 using a deposition process, such as physical vapor deposition (PVD). Examples of physical vapor deposition (PVD) that are suitable for forming the first metal semiconductor alloy 30, 35 include sputtering and plating. Examples of sputtering apparatuses suitable for forming the first metal semiconductor alloy 30, 35 include DC diode type systems, radio frequency (RF) sputtering, magnetron sputtering, and ionized metal plasma (IMP) sputtering. Following deposition, the structure is then subjected to an annealing step using conventional processes such as, but not limited to, rapid thermal annealing. During thermal annealing, the deposited metal reacts with Si forming a metal silicide. The remaining unreacted metal is removed by an etch process that is selective to the silicide. In addition to silicide, other metal semiconductor alloys can be formed utilizing similar processes as described above.

In one example, the first metal semiconductor alloy 30, 35 is composed of nickel (Ni), platinum (Pt) and silicon (Si), which in some instances can be referred to as nickel platinum silicide. In another example, the first metal semiconductor alloy 30, 35 is composed of nickel silicide (NiSi, $NiSi_2$).

FIG. 1 further depicts one embodiment of forming a conformal dielectric layer 40 over at least the gate structure 10, the at least one spacer 15, the first metal semiconductor alloy 30 that is present on the source region 20, and the first metal semiconductor alloy 35 that is present on the drain region 25. The conformal dielectric layer 40 may be formed using thermal growth or deposition. In one example, the conformal dielectric layer 40 is formed using thermal oxidation and is composed of silicon oxide. In another example, the conformal dielectric layer 40 is formed by a deposition process, such as chemical vapor deposition (CVD). Variations of CVD processes suitable for depositing the conformal dielectric layer 40 include, but are not limited to, Atmospheric Pressure CVD (APCVD), Low Pressure CVD (LPCVD) and Plasma Enhanced CVD (EPCVD), Metal-Organic CVD (MOCVD) and others. The thickness of the material layer for the conformal dielectric layer 40 typically ranges from 1.0 nm to 10.0 nm. In another embodiment, the material layer for the conformal dielectric layer 40 has a thickness that ranges from 2.0 nm to 5.0 nm.

The material of the conformal dielectric layer 40 is typically a dielectric material. For example, the material of the conformal dielectric layer 40 may be an oxide, nitride or oxynitride material. In one embodiment, the conformal dielectric layer 40 is composed of silicon nitride. The material for the conformal dielectric layer 40 is selected so that it may be etched selectively to the at least one spacer 15, the gate structure 10 and the semiconductor substrate 5. In one example, when the at least one spacer 15 is composed of silicon oxide ($SiO_2$), the conformal dielectric layer 40 may be composed of silicon nitride ($Si_3N_4$). In another example, when the at least one spacer 15 is composed of silicon nitride ($Si_3N_4$), the conformal dielectric layer 40 may be composed of silicon oxide ($SiO_2$). It is noted that these materials are provided for illustrative examples only, and is not intended to limit the disclosure.

In one embodiment, a first interlevel dielectric layer 45 is deposited atop the conformal dielectric layer 40. The composition of the first interlevel dielectric layer 45 may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the first interlevel dielectric layer 45 include, any of the aforementioned materials in porous form, or in a form that changes during processing to or from being porous and/or permeable to being non-porous and/or non-permeable.

In one embodiment, in which the conformal dielectric layer 40 is composed of amorphous carbon, the first interlevel dielectric layer 45 may be composed of silicon oxide. The first interlevel dielectric layer 45 may be deposited using chemical vapor deposition (CVD). In addition to chemical vapor deposition (CVD), the first interlevel dielectric layer 45 may also be formed using spinning from solution, spraying from solution, and evaporation.

Following deposition, the first interlevel dielectric layer 45 is planarized until the upper surface of the gate structure 10 is exposed. In one embodiment, the planarization is continued until the first interlevel dielectric layer 45 and the conformal dielectric layer 40 is removed from over the gate structure 10 to expose the upper surface of the first dielectric cap 9. "Planarization" is a material removal process that employs at least mechanical forces, such as frictional media, to produce a planar surface. In one embodiment, the planarization process includes chemical mechanical polishing (CMP) or grinding. Chemical mechanical planarization (CMP) is a material removal process using both chemical reactions and mechanical forces to remove material and planarize a surface.

Figure 2:
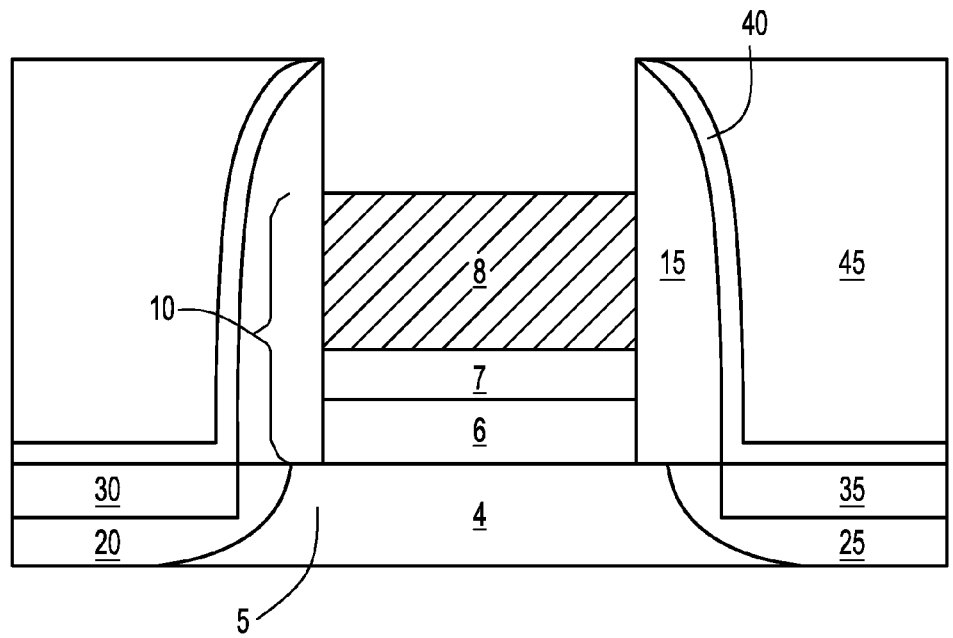
FIG. 2 is a side cross-sectional view depicting one embodiment of removing a first dielectric cap of the gate structure with an etch that is selective to the semiconductor containing gate conductor of the gate structure, in accordance with the present disclosure.

FIG. 2 depicts removing the first dielectric cap 9 of the gate structure 10 with an etch that is selective to the semiconductor containing gate conductor 8 of the gate structure 10. The etch may be an isotropic etch or an anisotropic etch. The anisotropic etch may include reactive-ion etching (RIE). Other examples of anisotropic etching that can be used at this point of the present disclosure includes ion beam etching, plasma etching or laser ablation. In comparison to anisotropic etching, isotropic etching is non-directional. One example of an isotropic etch is a wet chemical etch.

Figure 3:
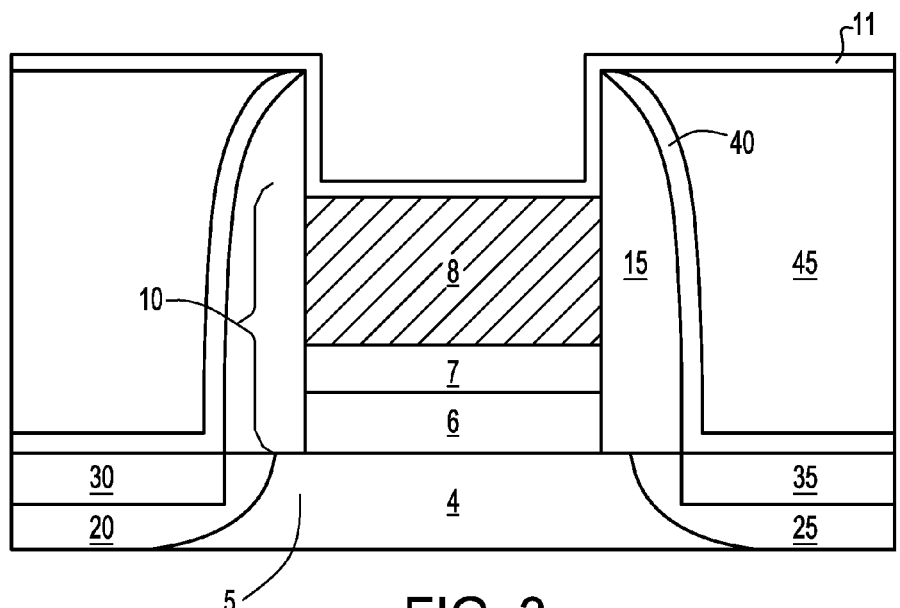
FIG. 3 is a side cross-sectional view depositing a second metal layer on at least an exposed surface of the semiconductor containing gate conductor of the gate structure, in accordance with one embodiment of the present disclosure.

FIG. 3 depicts depositing a second metal layer 11 on at least an exposed surface of the semiconductor containing gate conductor 8 of the gate structure 10. In one embodiment, the second metal layer 11 is blanket deposited atop the structure depicted in FIG. 2, in which the second metal layer 11 is also formed on the upper surface of the first interlevel dielectric layer 45. The second metal layer 11 may be formed using a deposition process, such as physical vapor deposition (PVD). Examples of physical vapor deposition (PVD) that are suitable for forming the second metal layer 11 include sputtering and plating. Examples of sputtering apparatuses suitable for forming the second metal layer 11 include DC diode type systems, radio frequency (RF) sputtering, magnetron sputtering, and ionized metal plasma (IMP) sputtering. The second metal layer 11 may be composed of at least one metal selected from the group including W, Sc, Y, Ho, Gd, Lu, Dy, Tb, Er, Yb, Hf, Ir, Pt, Os or combinations thereof. The thickness of the second metal layer 11 may range from 1.0 nm to 10.0 nm. In another embodiment, the second metal layer 11 has a thickness that ranges from 2.0 nm to 5.0 nm.

Figure 4:
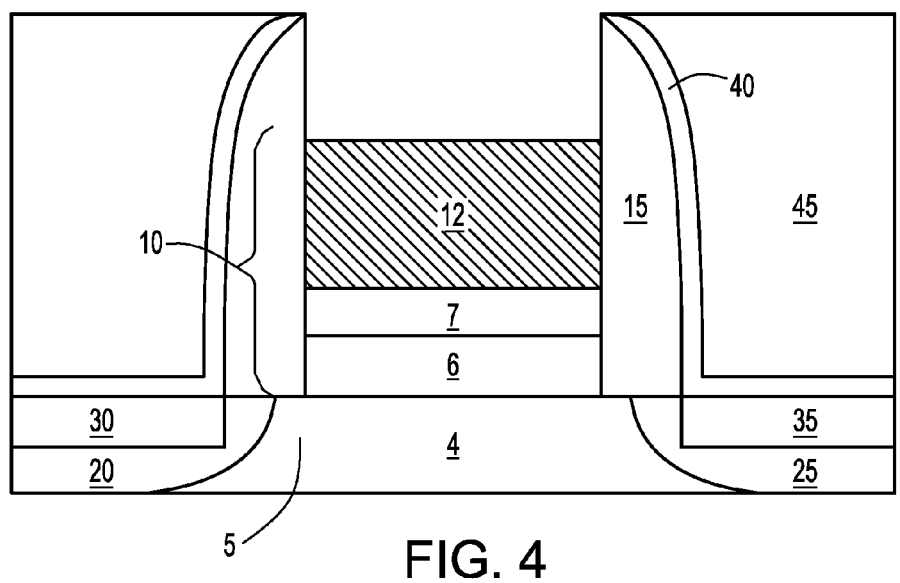
FIG. 4 is a side cross-sectional view depicting annealing to intermix the second metal layer and the semiconductor containing gate conductor, in which the semiconductor containing gate structure is converted to a second metal semiconductor alloy, in accordance with one embodiment of the present disclosure.

FIG. 4 depicts annealing to intermix the second metal layer 11 and the semiconductor containing gate conductor 8, in which the semiconductor containing gate structure 8 is converted to a second metal semiconductor alloy 12. In one embodiment, the annealing may be provided by thermal anneal, rapid thermal anneal, laser anneal or combinations thereof. In one embodiment, the annealing is at a temperature ranging from about 20° C. to about 1000° C. In another embodiment, the annealing is at a temperature ranging from about 200° C. to about 1000° C. In one embodiment, the annealing is conducted until the entire semiconductor containing gate conductor is fully silicided. By "fully silicided" it is meant that the entire thickness of the semiconductor containing gate conductor is intermixed with a metal to form the second metal semiconductor alloy 12. The fully silicided semiconductor containing gate conductor typically includes metal elements intermixed with the semiconductor elements extending from the upper surface of the semiconductor containing gate conductor to the base surface of the semiconductor containing gate conductor. In one embodiment, the second metal semiconductor alloy 12 that provides the fully silicided gate conductor is composed of nickel silicide, cobalt silicide (CoSi) or cobalt disilicide ($CoSi_2$). Examples of nickel silicides that are suitable for the second metal semiconductor alloy 12 include $Ni_3Si$, $Ni_{31}Si_{12}(Ni_5Si_2)$, $Ni_2Si$, $Ni_3Si_2$, NiSi, $NiSi_2$ and combinations thereof. In some embodiments, the composition of the second metal semiconductor alloy 12 is selected to limit volumetric expansion of the portion of the gate conductor that includes the second metal semiconductor alloy 12.

Following alloying of the second metal layer 11 and the semiconductor containing gate structure 8, the non-reacted portions of the second metal layer 11 are removed with an etch that is selective to the second metal semiconductor alloy 12. The etch for removing the non-reacted portions of the second metal layer 11 may also be selective to the first interlevel dielectric layer 45.

Figure 5:
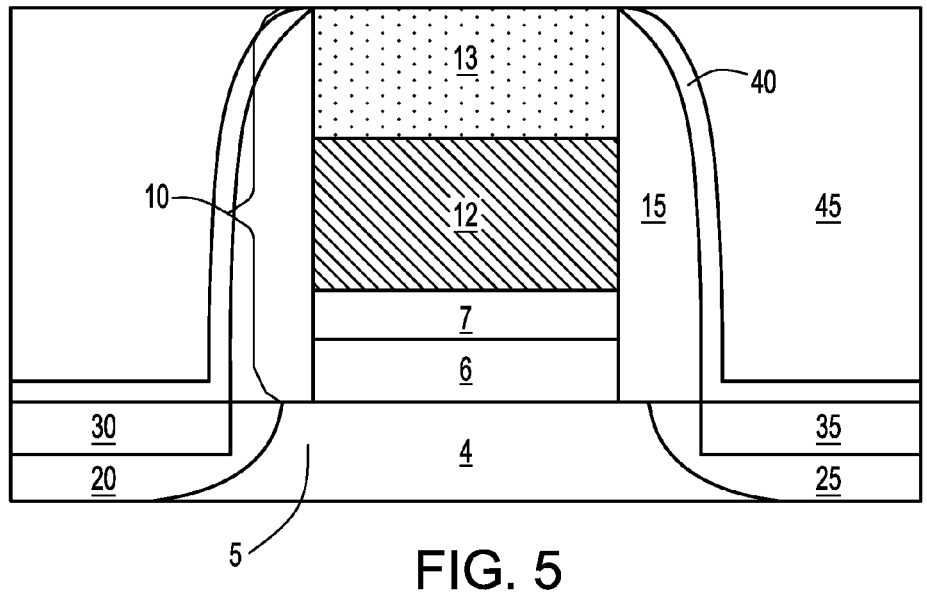
FIG. 5 is a side cross-sectional view depicting forming a second dielectric cap on the second metal conductor alloy having an upper surface that is coplanar with the upper surface of the first interlevel dielectric layer, in accordance with one embodiment of the present disclosure.

FIG. 5 depicts forming a second dielectric cap 13 on the second metal conductor alloy layer 12. The second dielectric cap 13 typically has an upper surface that is coplanar with the upper surface of the first interlevel dielectric 45. The second dielectric cap 13 may be composed of any material that allows for the first interlevel dielectric layer 45 to be removed by an etch that is selective to the second dielectric cap 13. For example, the second dielectric cap 13 may be composed of a nitride, oxide or oxynitride material. In some embodiments, the second dielectric cap 13 is composed of an oxide, nitride or oxynitride material. In one embodiment, in which the conformal dielectric layer 40 is composed of a nitride, such as silicon nitride, and the first interlevel dielectric layer 45 is composed of an oxide, such as silicon oxide, the second dielectric cap 13 may be composed of a nitride, such as silicon nitride.

The second dielectric cap 13 is typically formed using a deposition method. In one example, the second dielectric cap 13 is formed from a blanket deposited material layer. The material layer for the second dielectric cap 13 may be deposited on the upper surface of the first interlevel dielectric layer 45, and may be deposited to a thickness that fills the void over the second metal semiconductor alloy 12 of the gate structure 10 that is produced by removing the first dielectric cap 9.

Following deposition, the material layer for the second dielectric cap 13 is planarized until the upper surface of the remaining portion of the material for the second dielectric cap 13 is coplanar with the upper portion of the first interlevel dielectric layer 45. In one embodiment, the planarization process includes chemical mechanical polishing (CMP) or grinding.

Figure 6:
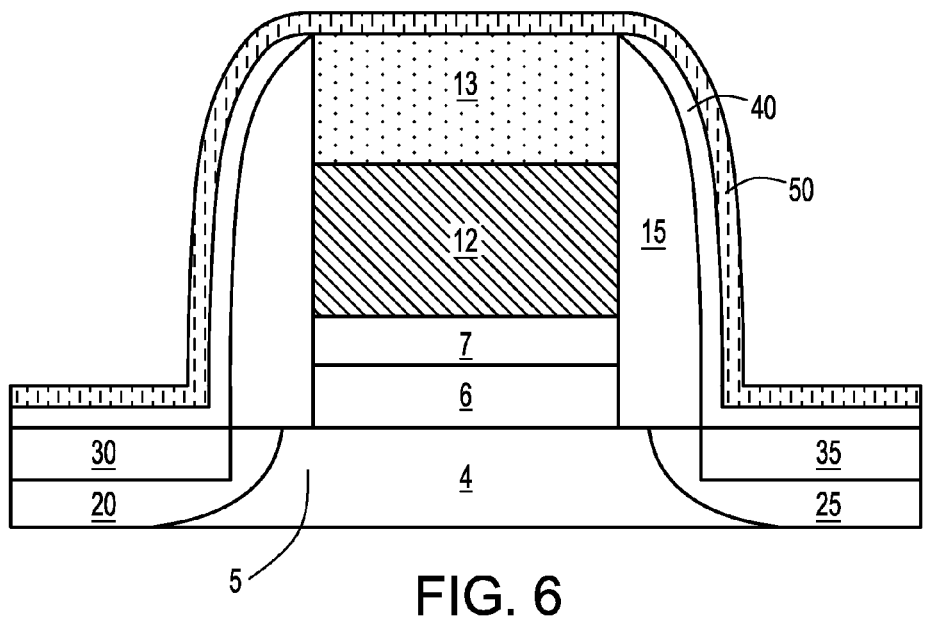
FIG. 6 is a side cross-sectional view depicting removing the first interlevel dielectric layer, and forming a continuous encapsulating layer over the surface of the first metal semiconductor alloy, the spacer and the gate structure, in accordance with one embodiment of the present disclosure.

FIG. 6 depicts removing the first interlevel dielectric layer 45. In one embodiment, the first interlevel dielectric layer 45 is removed by an etch process that is selective to the second dielectric cap 13 and the conformal dielectric layer 40. In one example, in which the first interlevel dielectric 45 is composed of an oxide, such as silicon oxide, and the conformal dielectric layer 40 and the second dielectric cap 13 is composed of a nitride, such as silicon nitride, the etch process for removing the first interlevel dielectric layer 45 may be provided by a chemical oxide removal (COR) process. In one embodiment, COR process includes exposing the structure to a gaseous mixture of HF and ammonia at a pressure of 30 mTorr or below. In one embodiment, the COR process further includes a pressure between 1 mTorr and 10 mTorr, and a temperature of 25° C. or greater. The ratio of gaseous HF to gaseous ammonia may range from 1:10 to 10:1. In one example, the ratio of gaseous HF to gaseous ammonia is 2:1. In one example, a solid reaction product is formed as a result of the structure's exposure to HF and ammonia gas. The solid reaction product includes etched oxide, reactants or combinations thereof. The solid reaction product is removed in a second step which includes heating the structure to a temperature about 100° C., thus causing the reaction product to evaporate, and rinsing the structure in water.

FIG. 6 also depicts forming a continuous encapsulating layer 50 over the surface of the first metal semiconductor alloy 30, 35, the at least one spacer 15 and the gate structure 10. The continuous encapsulating layer 50 is typically a single material layer. The continuous encapsulating layer 50 may be in direct contact with the conformal dielectric layer 40 that is present on the upper surface of the first metal semiconductor alloy 30, 35 and the at least one spacer, and may be in direct contact with the upper surface of the second dielectric cap 13 of the gate structure 10. The continuous encapsulating layer 50 is typically composed of a dielectric material, such as an oxide, nitride or oxynitride. In one embodiment, the continuous encapsulating layer 50 is composed of a high-k dielectric material. One high-k dielectric material that is suitable for the continuous encapsulating layer 50 is hafnium oxide ($HfO_2$). Other examples of suitable high-k dielectric materials for the continuous encapsulating layer 50 include hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one embodiment, the continuous encapsulating layer 50 hermetically seals the gate structure 10.

The continuous encapsulating layer 50 typically protects the gate structure 10 of the semiconductor device from being shorted to the later formed interconnects. As the semiconductor devices are scaled to smaller and smaller dimensions, the distance separating the gate structures of adjacent semiconductor devices is reduced. As the distance between the adjacent semiconductor devices decreases, the potential for shorting of the interconnects to the gate structures 10 increases. The continuous encapsulating layer 50 protects the gate structure 10 from being shorted by providing an etch stop that is entirely continuous, in which the etch stop is entirely free of breaks. The etch process for forming the via openings to the source and drain regions is selected to provide that the etch chemistry is selective to the continuous encapsulating layer 50. Because the etch process that forms the via openings for the interconnects does not etch the continuous encapsulating layer 50, and the continuous encapsulating layer 50 covers the entirety of the gate structure 10, the entire gate structure 10 is protected by the continuous encapsulating layer 50. Therefore, the entire gate structure 10 is electrically isolated from the later formed interconnects by the continuous encapsulating layer 50.

Figure 7:
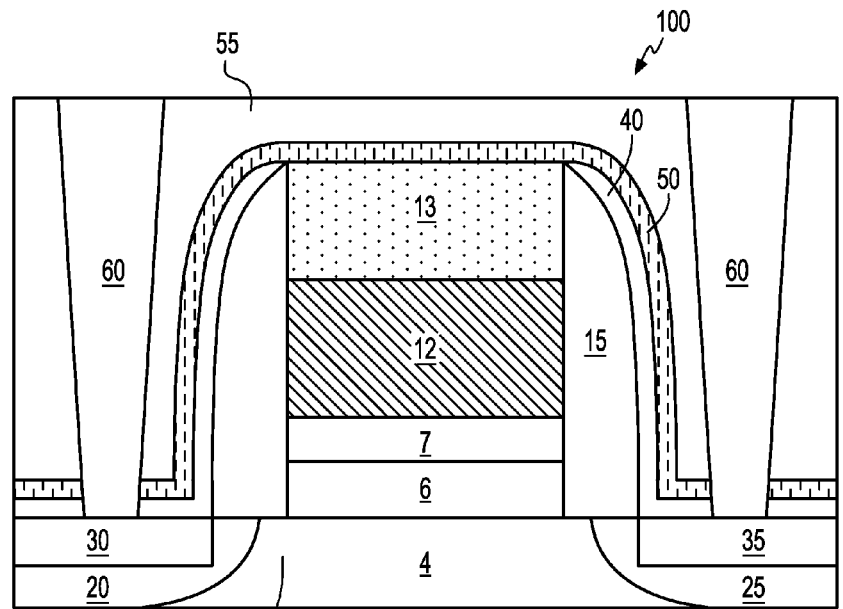
FIG. 7 is a side cross-sectional view depicting forming a second interlevel dielectric atop the structure depicted in FIG. 6, and forming interconnects to the source and drain regions of the semiconductor device, in accordance with one embodiment of the present disclosure.

FIG. 7 depicts forming a second interlevel dielectric layer 55 over the structure depicted in FIG. 6, and forming interconnects 60 to the source regions 20 and drain regions 25 of the semiconductor device 100. Because the continuous encapsulating layer 50 covers the entirety of the gate structure 10, and the etch process for forming the via openings for the interconnects 60 is selective to the continuous encapsulating layer 50, the present disclosure provides a self aligned contact (SAC) forming process.

The composition of the second interlevel dielectric layer 55 may be selected from the group consisting of silicon-containing materials such as $SiO_2$, $Si_3N_4$, $SiO_xN_y$, SiC, SiCO, SiCOH, and SiCH compounds, the above-mentioned silicon-containing materials with some or all of the Si replaced by Ge, carbon-doped oxides, inorganic oxides, inorganic polymers, hybrid polymers, organic polymers such as polyamides or SiLK™, other carbon-containing materials, organo-inorganic materials such as spin-on glasses and silsesquioxane-based materials, and diamond-like carbon (DLC, also known as amorphous hydrogenated carbon, α-C:H). Additional choices for the second interlevel dielectric layer 55 include, any of the aforementioned materials in porous form, or in a form that changes during processing to or from being porous and/or permeable to being non-porous and/or non-permeable.

Via openings may be formed to expose an upper surface of the first metal semiconductor alloy 30, 35 on the source region 20 and the drain region 25. The via openings may be formed using photolithography and etch processes. For example, a photoresist etch mask can be produced by applying a photoresist layer to the upper surface of the second interlevel dielectric layer 55, exposing the photoresist layer to a pattern of radiation, and then developing the pattern into the photoresist layer utilizing a resist developer. The photoresist etch mask may be positioned so that the portions of the second interlevel dielectric layer 55 that are not protected by the photoresist etch mask may be etched in order to provide the via openings. The exposed portion of the second interlevel dielectric layer 55 is then removed by a selective etch. In one embodiment, the selective etch removes the material of the second interlevel dielectric layer 55 selectively to continuous encapsulating layer 50. The etch that removes the exposed portion of the second interlevel dielectric layer 55 may be an anisotropic etch. Examples of anisotropic etch process suitable for forming the via openings include, but are not limited to, reactive-ion etching (RIE), ion beam etching, plasma etching and/or laser ablation. Because the etch process that forms the via openings through the second interlevel dielectric layer 55 does not etch the continuous encapsulating layer 50, and the continuous encapsulating layer 50 covers the entirety of the gate structure 10, the entire gate structure 10 is protected by the continuous encapsulating layer 50.

In one embodiment, following the etching of the second interlevel dielectric layer 55, the exposed portion of the continuous encapsulating layer 50 is etched selective to the conformal dielectric layer 40. Thereafter, via openings are extended to the first metal semiconductor alloy 30, 35 by etching the exposed portion of the conformal dielectric layer 40 selectively to the upper surface of the first metal semiconductor alloy 30 of the source region 20, and the upper surface of the first metal semiconductor alloy 35 of the drain region 25.

Interconnects 60 may be formed in the via openings, in which the interconnects 60 are in direct contact with the upper surface of the first metal semiconductor alloy 30 to the source region 20, and the upper surface of the first metal semiconductor alloy 35 to the drain region 25. Interconnects 60 are formed by depositing a conductive metal into the via openings using a deposition process, such as physical vapor deposition (PVD). Examples of physical vapor deposition (PVD) that are suitable for forming the interconnects 60 include sputtering and plating. Examples of sputtering apparatuses suitable for forming the interconnect 60 include DC diode type systems, radio frequency (RF) sputtering, magnetron sputtering, and ionized metal plasma (IMP) sputtering. The interconnect 60 may also be formed using chemical vapor deposition. The interconnect 60 may be composed of a conductive metal, such as tungsten, copper, aluminum, silver, gold, and alloys thereof.

In one embodiment, the above-described method provides a semiconductor device 100 that includes a gate structure 10 on a channel region 4 of a semiconductor substrate 5. The gate structure 10 includes a gate dielectric 6 on the semiconductor substrate 5, a metal gate conductor 7 on the gate dielectric 6, and a gate conductor composed of a metal semiconductor alloy, e.g., second metal semiconductor alloy 12, on the metal gate conductor 7. At least one spacer 15 is present on the sidewalls of the gate structure 10. A source region 20 and a drain region 25 are present in the semiconductor substrate 5 on opposing sides of the channel region 4.

Each of the source region 20 and the drain region 25 include a metal semiconductor contact 30, 35 that may have a different composition than the metal semiconductor alloy, e.g., second metal semiconductor alloy 12, of the gate structure 10. In one embodiment, the metal semiconductor alloy, e.g., second metal semiconductor alloy 12, of the gate conductor is composed of cobalt silicide ($CoSi_2$), and the metal semiconductor contact 30, 35 is composed of nickel silicide.

The semiconductor device 100 may further include a continuous encapsulating layer 50 extending over the gate structure 10, the at least one spacer 15, and the source and drain region 20, 25. The continuous encapsulating layer 50 electrically isolates the gate structure 10 from the interconnects 60 to the source and drain regions 20, 25. By "electrically isolates" it is meant that the continuous encapsulating layer 50 obstructs electrical current from being transmitted from the interconnects 60 to the gate structure 10. In one embodiment, the continuous encapsulating layer 50 eliminates electrical shorting between the interconnects 60 and the gate structure 10. In one embodiment, the continuous encapsulating dielectric layer 50 is composed of a high-k dielectric. The semiconductor device 100 may also include a uniform dielectric layer 40 between the continuous encapsulating layer 50, the at least one spacer 15 and the first metal semiconductor alloy contact 30, 35 that is present on the source region 20 and the drain region 25. Although FIGS. 1-7 depicts a single semiconductor device 100, it is noted that the present disclosure may be applicable to any number of semiconductor devices.

Figure 8:
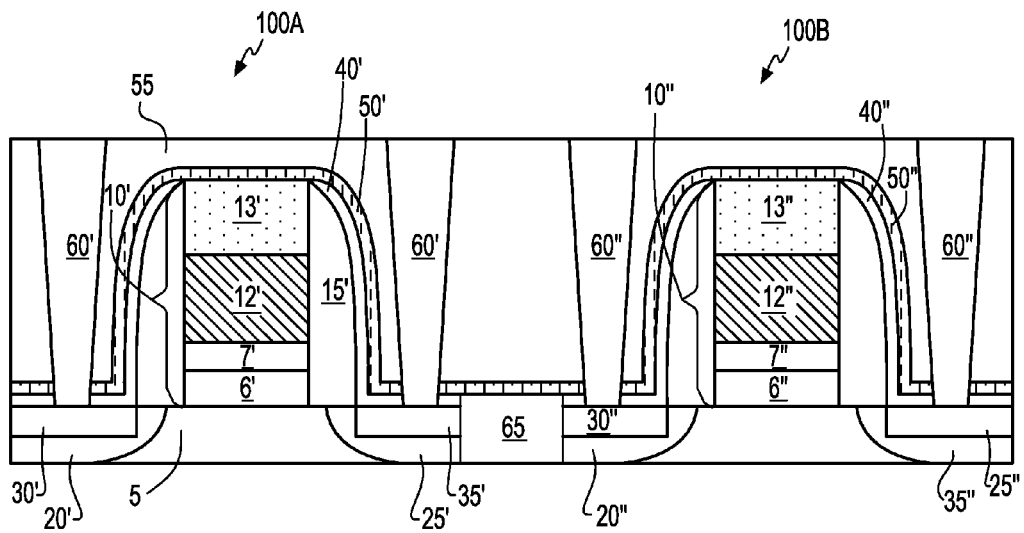
FIG. 8 is a side cross-sectional view depicting a complementary metal oxide semiconductor (CMOS) device, in accordance with one embodiment of the present disclosure.

For example, FIG. 8 depicts one embodiment of a complementary metal oxide semiconductor (CMOS) device on a semiconductor device 5, in which the CMOS device includes a continuous encapsulating layer 50 that is present over each of the semiconductor devices 100A, 100B. A CMOS device is a semiconductor device that includes at least one p-type semiconductor device and at least one n-type semiconductor device. In one embodiment, the CMOS device includes an n-type conductivity semiconductor device 100A and a p-type conductivity semiconductor device 100B on a single semiconductor substrate 5.

The n-type semiconductor device 100A includes source and drain regions 20', 25' being doped with an n-type dopant. The n-type semiconductor device 100A further includes a first metal semiconductor alloy 30', 35' on the upper surface of the source and drain regions 20', 25'. The first metal semiconductor alloy 30', 35' is similar to the first metal semiconductor alloy 30, 35 described above with reference to FIG. 6. Therefore, the description of the first metal semiconductor alloy 30, 35 that is described above with reference to FIG. 6 is suitable for the first metal semiconductor alloy 30', 35' that is depicted in FIG. 8. The n-type semiconductor device 100A further includes a gate structure 10'. The gate structure 10' includes a gate dielectric 6', a metal gate conductor 7', a second metal semiconductor alloy 12' and a second dielectric cap 13'. The gate structure 10' depicted in FIG. 8 is similar to the gate structure 10 that is described above with reference to FIGS. 1-5. Therefore, the description of the gate structure 10 that is described above with reference to FIGS. 1-4 is suitable for the first metal semiconductor alloy 30', 35' that is depicted in FIG. 8. The metal gate conductor 7' of the gate structure 10' may be an n-type work function metal layer, as described above with reference to FIG. 1.

The p-type semiconductor device 100B includes source and drain regions 20", 25" being doped with an p-type dopant. The p-type semiconductor device 100B further includes a first metal semiconductor alloy 30", 35" on the upper surface of the source and drain regions 20", 25". The first metal semiconductor alloy 30", 35" is similar to the first metal semiconductor alloy 30, 35 described above with reference to FIG. 6. Therefore, the description of the first metal semiconductor alloy 30, 35 that is described above with reference to FIG. 6 is suitable for the first metal semiconductor alloy 30", 35" that is depicted in FIG. 8. The p-type semiconductor device 100B further includes a gate structure 10". The gate structure 10" includes a gate dielectric 6", a metal gate conductor 7", a second metal semiconductor alloy 12" and a second dielectric cap 13". The gate structure 10" depicted in FIG. 8 is similar to the gate structure 10 that is described above with reference to FIGS. 1-5. Therefore, the description of the gate structure 10 that is described above with reference to FIGS. 1-4 is suitable for the first metal semiconductor alloy 30", 35" that is depicted in FIG. 8. The metal gate conductor 7" of the gate structure 10" may be a p-type work function metal layer, as described above with reference to FIG. 1. The n-type conductivity semiconductor device 100A is separated from the p-type semiconductor device 100B by an isolation region 65.

As semiconductor devices 100A, 100B are scaled to provide above described pitch or lesser pitches, the interconnects 60', 60" to the source and drain regions 20', 20", 25', 25", can short to the gate structure 10', 10" of the n-type semiconductor device 100A and the p-type semiconductor device 100B. To eliminate shorting to the gate structures 10', 10", a single continuous encapsulating layer 50' may extend over the gate structure 10' of the n-type conductivity semiconductor device 100A, and the gate structure 10" of p-type conductivity semiconductor device 100B. The single continuous encapsulating layer 50' also extends over the upper surface of the isolation region 65 that separates the n-type conductivity semiconductor device 100A from the p-type conductivity semiconductor device 100B. The single continuous encapsulating layer 50' is an etch stop that is entirely continuous, in which the etch stop is entirely free of breaks. Each of the n-type semiconductor device 100A and the p-type semiconductor device 100B may further include a conformal dielectric layer 40', 40" that is present between the continuous encapsulating layer 50' and the spacer 15', 15" and the first metal semiconductor alloy 30', 35', 30", 35". Because the continuous encapsulating layer 50' covers the entirety of the gate structures 10', 10" and is free of breaks to the gate structures 10', 10", and the etch process for forming the via openings for the interconnects 60', 60" is selective to the continuous encapsulating layer 50', the present disclosure provides a self aligned contact (SAC) forming process that substantially eliminates shorting between the interconnects 60', 60" and the gate structures 10', 10".

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A semiconductor device comprising:
    a gate structure on a channel region of a semiconductor substrate, wherein the gate structure includes a gate dielectric on the semiconductor substrate, a metal gate conductor on the gate dielectric and a metal semiconductor alloy gate conductor on the metal gate conductor;
    at least one spacer present on the sidewalls of the gate structure;
    a source region and a drain region present in contact with the semiconductor substrate on opposing sides of the channel region, wherein each of the source region and the drain region include a metal semiconductor contact having a different composition than the metal semiconductor alloy gate conductor;
    a continuous encapsulating dielectric layer extending over the gate structure, the at least one spacer and at least a portion of the source and drain region, wherein the continuous encapsulating dielectric layer is composed of a high-k dielectric selected from the group consisting of hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof;
    a uniform dielectric layer positioned between the continuous encapsulating dielectric layer, the entire outermost and topmost surfaces of said at least one spacer and the metal semiconductor contact and having a base directly contacting a topmost surface of said semiconductor substrate; and
    a dielectric layer overlaying said continuous encapsulating dielectric layer, wherein said continuous encapsulating dielectric layer covers the entirety of the gate structure.

2. The semiconductor device of claim 1, wherein the metal semiconductor alloy gate conductor is comprised of cobalt silicide ($CoSi_2$), and the metal semiconductor contact is comprised of nickel silicide.

3. The semiconductor device of claim 1, wherein the continuous encapsulating dielectric layer is composed hafnium oxide.

4. The semiconductor device of claim 1, wherein the semiconductor device is an n-type conductivity semiconductor device, wherein the source region and the drain region are doped to an n-type conductivity.

5. The semiconductor device of claim 1, wherein the semiconductor device is a p-type conductivity semiconductor device, wherein the source region and the drain region are doped to a p-type conductivity.

6. The semiconductor device of claim 1, wherein the semiconductor device is a field effect transistor.

7. A semiconductor device comprising:
    a gate structure on a channel region of a semiconductor substrate, wherein the gate structure includes a gate dielectric on the semiconductor substrate, a metal gate conductor on the gate dielectric and a metal semiconductor alloy gate conductor on the metal gate conductor;
    at least one spacer present on the sidewalls of the gate structure;
    a source region and a drain region present in contact with the semiconductor substrate on opposing sides of the channel region, wherein each of the source region and the drain region include a metal semiconductor contact having a different composition than the metal semiconductor alloy gate conductor;
    a continuous encapsulating dielectric layer extending over the gate structure, the at least one spacer and at least a portion of the source and drain region;
    a uniform dielectric layer positioned between the continuous encapsulating dielectric layer, the entire outermost and topmost surfaces of said at least one spacer and the metal semiconductor contact and having a base directly contacting a topmost surface of said semiconductor substrate; and
    a dielectric layer overlaying said continuous encapsulating dielectric layer, wherein said continuous encapsulating dielectric layer covers the entirety of the gate structure.

8. The semiconductor device of claim 7, wherein the metal semiconductor alloy gate conductor is comprised of cobalt silicide ($CoSi_2$), and the metal semiconductor contact is comprised of nickel silicide.

9. The semiconductor device of claim 7, wherein the continuous encapsulating dielectric layer is composed hafnium oxide.

10. The semiconductor device of claim 7, wherein the semiconductor device is an n-type conductivity semiconductor device, wherein the source region and the drain region are doped to an n-type conductivity.

11. The semiconductor device of claim 7, wherein the semiconductor device is a p-type conductivity semiconductor device, wherein the source region and the drain region are doped to a p-type conductivity.

12. The semiconductor device of claim 7, wherein the semiconductor device is a field effect transistor.

* * * * *